United States Patent [19]

Delepaut

[11] Patent Number: 5,444,358

[45] Date of Patent: Aug. 22, 1995

[54] POWER SUPPLY SHUNT REGULATOR WITH CURRENT LIMITATION CIRCUIT THEREIN

[75] Inventor: Christophe Delepaut, Dilbeek, Belgium

[73] Assignee: Alcatel Bell-SDT, S.A., Charleroi, Belgium

[21] Appl. No.: 206,061

[22] Filed: Mar. 4, 1994

[30] Foreign Application Priority Data

Mar. 4, 1993 [EP] European Pat. Off. ............ 93103448

[51] Int. Cl.⁶ ............................................... G05F 1/10
[52] U.S. Cl. .................................... 323/222; 323/282
[58] Field of Search ............... 323/220, 222, 223, 232, 323/282, 285, 286, 287, 289, 908

[56] References Cited

U.S. PATENT DOCUMENTS

| | | | |
|---|---|---|---|
| 4,837,495 | 6/1989 | Zansky | 323/222 |
| 5,001,413 | 3/1991 | Ohms | 323/282 |
| 5,045,771 | 9/1991 | Kislovski | 323/282 |
| 5,067,066 | 11/1991 | Chida | 323/222 |

FOREIGN PATENT DOCUMENTS

| | | | |
|---|---|---|---|
| 0493185A1 | 7/1992 | France | H03K 17/16 |
| 3335520A1 | 4/1985 | Germany | G05F 1/60 |

OTHER PUBLICATIONS

Noordwijk, The Netherlands, 21–23 Sep. 1977, "Proceedings of the Third Estec Spacecraft Power Conditioning", O'Sullivan et al., pp. 123–131.

I. R. White, "Design and Development of a Sequential Switching Shunt Regulator", Proceedings of the Third ESTEC Spacecraft Power Conditioning Seminar held at Noordwijk, The Netherlands, 21–23 Sep. 1977, pp. 133–136.

*Primary Examiner*—Thomas M. Dougherty
*Assistant Examiner*—Matthew V. Nguyen
*Attorney, Agent, or Firm*—Frishauf, Holtz, Goodman

[57] ABSTRACT

A power supply shunt regulator (PSSR) regulates the current flowing to a branch (FET, $L_D$, CSR) coupled in parallel to a power supply (SA) and an electrical load (EL). The regulator limits the discharge current from a parasitic capacitance (PSC) of the power supply (SA) when a shunt switch (FET) included in the branch is turned "ON". An active negative feedback loop (CLM, FET) therefore regulates the current flow through the branch by measuring a voltage drop over a current sensing resistor (CSR) included in the branch and by deriving a control signal (ACTRL) for the shunt switch in such a way that this voltage drop is critically damped to a maximum voltage drop. This damping can be done in a simple way by selecting the shunt switch to be a field effect transistor. Due to the fact that an inductor ($L_H$) is coupled to the source of the shunt switch, stable operation is insured. The power supply regulator is particularly well suited for use in a spacecraft wherein a number of power supply units, in each of which the power supply comprises a specific solar array, are used to supply power to the electrical load.

10 Claims, 2 Drawing Sheets

POWER SUPPLY SHUNT REGULATOR WITH CURRENT LIMITATION CIRCUIT THEREIN

BACKGROUND OF THE INVENTION

1. Field of the Invention

The present invention relates to a power supply shunt regulator that includes a branch which, in turn, includes a series connection of at least a shunt switch and an inductive means and which is coupled in parallel with both a load and a power supply, said regulator including current limitation means for generating an analog control signal that is applied to a control electrode of said shunt switch so as to limit the amount of current flowing through said shunt switch.

2. Background

Such a power supply shunt regulator is already known in the art, e.g. from the article "Design and Development of a Sequential Switching Shunt Regulator", by I. R. White, Proc. of the 3d ESTEC Spacecraft Power Conditioning Seminar, Noordwijk (NL), 21–23 Sep. 1977, pp. 133–136, the entire contents of which is incorporated herein by reference. This prior art regulator is used to control the power supplied to the load by the power supply which comprises solar cells.

A problem with the prior art shunt regulator is that, when the shunt switch is turned on, the parasitic capacitance across a power supply discharges abruptly due to a short circuit which is established. The current peak caused by this discharge may damage the shunt switch and thus reduces the system reliability. This is all the more worrying when the frequency with which the shunt switch is turned on and off is relatively high and when the regulator is used in a spacecraft which requires very high reliability.

The known prior art regulator shown in FIG. 7 of the above-mentioned White article, limits this discharge current via a current limitation means which includes in particular a capacitor C1 shown in FIG. 4 of the White article. This capacitor artificially increases the Miller capacitance of the shunt switch, formed by transistors T2 and T3 shown therein, and thereby slows down the response of the regulator to limit the current flow through the switch to a value which is dependent on the parasitic capacitance across the power supply and limits the power supplied by the power supply.

Since the power supplied and the value of the parasitic capacitance are non-linear and are time and temperature dependent, this known regulator has to limit the current to a value which is substantially lower than a maximum current that may be required by a specific application, by taking into account the above variations. In this way, less current is available for the discharge of the parasitic capacitance which provides a slower discharge and consequently also provides a larger power dissipation time in the shunt switch. This larger power dissipation time diminishes the reliability of the regulator.

Moreover, the design of the prior art regulator such as disclosed in the White Article has to be redone for every application which is characterized by other parameters, for instance a different parasitic capacitance. A further drawback of this known regulator is that the shunt switch is made with bipolar transistors which, has a relatively high saturation voltage when turned "ON". Bipolar transistors dissipate relatively larger amounts of energy, thus complicating the design and increasing the dimensions of the regulator.

SUMMARY OF THE INVENTION

Accordingly, an object of the present invention is to provide a shunt regulator of the above type but which limits the current to a value, that is independent of the power supply characteristics and which dissipates less energy when the shunt switch is turned "ON".

Briefly, in accordance with the present invention, a power supply shunt regulator (PSSR) includes a branch circuit therein which in turn includes a series connection of at least a shunt switch and an inductive means, said branch circuit being coupled in parallel with both a load and a power supply. Said power supply shunt regulator further includes current limitation means for generating an analog control signal that is applied to a control electrode of said shunt switch so as to limit the amount of current flowing through said shunt switch. The shunt switch comprises a field effect transistor and the current limitation means comprises a negative feedback loop that is coupled between a current sensing resistor forming part of said series connection and said control electrode for regulating said analog control signal so that a voltage drop across said current sensing resistor is lower than a maximum voltage drop and wherein said inductive means is coupled to a source electrode of said field effect transistor.

By providing a current limitation means in the form of an active feedback control loop of the above type, it can be easily verified that the above objective is reached. Indeed, the peak discharge current will clearly be limited to a fixed value dependent solely on the resistance of the current sensing resistor and a transfer function of the analog control signal realized by the current limitation means.

In order to improve the energy dissipation of the present shunt regulator when the shunt switch is turned "ON", the shunt switch is configured as a Field Effect Transistor (FET) having a relatively low saturation voltage. In spite of this major advantage, the use of an FET has a drawback in that it has a relatively high drain-to-source parasitic capacitance value which gives rise to instability of the system in which the regulator is active. It can indeed be verified that the coupling between an inevitable inductance of the power supply lines, in a solar array field commonly known as a harness inductance, and the parasitic capacitance across the terminals of the shunt switch is unstable. This instability would normally overly complicate the active feedback control loop.

In view of the above, the invention can further be appreciated as based on the insight that this instability resulting from the use of an FET is removed by providing a suitable degenerative inductive means, i.e. an inductor coupled between for instance the source of an n-FET shunt switch and a ground terminal. This limits the current variation in the branch by influencing the control voltage of the FET as explained below. Moreover, and due to this stabilization, the transfer function of the current limitation means can be of the optimal type as explained in detail below.

A feature of the present invention ensuring the mentioned stabilization is that the inductance of said inductive means is such that the poles of the following function are in the left half (imaginary) plane:

$$H(s) = \frac{G}{1 + G L_D s + PTC L_H s^2}$$

wherein $L_D$ is said inductance, G the voltage-to-current-gain of said shunt switch, PTC the parasitic drain-to-source capacitance of said field effect transistor, $L_H$ the equivalent inductance of the power supply lines interconnecting said power supply with said branch and s the Laplacian variable.

A further disadvantage of the known regulator of the White article leading to an unnecessary increase of the power dissipation is that the current flow through the shunt switch displays a significant current ripple. Indeed, due to this current ripple, less current is effectively available to discharge the parasitic capacitor across the power supply than the maximum current allowed to flow through the switch would permit. This means, as already mentioned, that it takes longer to discharge the parasitic capacitance and that more energy is dissipated in the shunt switch than is strictly needed.

A feature of the present invention which overcomes this heat dissipation drawback is that said current limitation means includes an active negative feedback current controller deriving from a regulating input signal comprising said voltage drop, a regulating output signal on which said analog control signal is based, and that the transfer function from said regulating input signal to said regulating output signal of said negative feedback current controller is determined in such a way that said voltage drop is critically damped to said maximum voltage drop.

In this way the above mentioned current ripple through the shunt switch is avoided. Indeed, with such a transfer function, the current flow through the shunt switch will reach its maximum value in such a way that the difference between this maximum current and the steady state current is optimally used to discharge the parasitic capacitor across the power supply.

It is to be noted that this advantageous transfer function can be achieved in a simple way because the active negative feedback loop as described above is used and because of the stabilization achieved by way of the inductive means. Indeed, without the latter the operation of a controller with the same transfer function could not give rise to the desired response of the voltage drop.

Further advantages provided by the present invention are that the load and said current sensing resistor are connected to a ground terminal and that said current limitation means includes drive means for generating said analog control signal based on said regulating output signal. Said drive means comprises a drive branch including a series connection of an amplifier means and a short circuit means, that are coupled between the floating terminals of said current sensing resistor and said load and generating said analog control signal as the voltage appearing on a junction point of said amplifier and short circuit means, said regulating output signal being the input signal to said amplifier means. Said current controller according to a particular preferred embodiment of the present invention further includes:

a feedback branch including the series connection of a current feed means and a current drain means and coupled in parallel with said load, said regulating output signal being generated at the junction point of said current feed and current drain means; and a polarization branch from which both said current feed and said current drain means are controlled and which is coupled in parallel with said drive branch; and wherein:

an increase in said regulating input signal leads to an increase/decrease in the current flowing through said current drain/feed means; and said current controller also includes a dynamic compensation branch coupled in parallel with said drive branch and the dynamic compensating branch includes the series connection of resistive means and capacitive means coupled to said junction point of said feedback branch; and wherein said amplifier means includes a Darlington pair of transistor amplifiers with associated load resistances which is coupled as a unity gain voltage amplifier; and said short circuit means comprises the series connection of two transistors coupled in parallel and a degenerative resistor.

In the above way, a drive means and an active controller are respectively provided, using only little hardware while offering low design complexity and high reliability.

The short circuit means included in the drive means ensures that the shunt switch is completely closed in the absence of an input signal to the amplifier means and in doing so, it is avoided that the shunt switch is damaged by excessive heat dissipation due to continuous linear behavior. Particularly, this short circuit means is such that the regulator is more robust with regard to threshold voltage lowering of the FET due to ageing and radiation and with regard to failures in the active controller, which is the reason the controller is made redundant by providing the two parallel transistors for it.

Furthermore, the active controller is designed in a very simple way by providing two branches, i.e., a feedback branch and a polarization branch, performing the basic feedback operation and using little hardware while the above-mentioned desired transfer function of the active controller is determined by way of a separate third branch, i.e., a dynamic compensation branch. This dynamic compensation branch provides a specific way out for the net current flowing from the junction point of the current feed and drain means, and can be easily designed to yield the desired transfer function since it will determine the voltage on the latter junction point. This voltage is the regulating output signal, and hence the input to the Darlington pair of transistors which is in turn coupled as a unity gain amplifier due to the short circuit means operating as a current source at FET turn "ON".

In more detail, it can be seen that the design of the active controller is very simple since it solely determines a proportional part of the desired transfer function through the resistive means and a dynamic part through the capacitive means.

Another advantage provided by the present invention is that said capacitive means comprises four compensation capacitors coupled in two parallel branches each of which comprises a series connection of two of said compensation capacitors, said four compensation capacitors being equivalent to one capacitor having a capacitance value equal to the capacitance value of each of said compensation capacitors.

This characteristic allows a dramatic reduction in the probability that one of two damaging failure modes of the compensation branch will occur.

The series redundancy prevents loss of the capacitive effect due to a short circuit which would result in a constant linear operation of the shunt switch with corresponding overdissipation and probable loss of the shunt switch.

The parallel capacitive redundancy prevents degeneration of the current controller to a non-optimal response due to the fact that the operation of the compensation branch is completely lost. Hence clearly the desired response of the voltage drop across the current sensing resistor can no longer be obtained which results in a higher maximum current flow in the shunt switch due to current overshoot. The latter problem is particularly critical in high reliability applications where a redundant shunt switch, with a corresponding duplicated regulator, is introduced in series with the first mentioned shunt switch. In that case, when the first mentioned shunt switch fails due to a short circuit, the power supply is not lost due to the fact that the redundant shunt switch can take over. The above parallel redundancy of the compensation capacitors diminishes the probability that the regulator of the first mentioned shunt switch operates without adequate current limitation in such a way that both shunt switches will be lost due to excessive current peaks. The parallel redundancy makes the capacitive means compatible with the series redundancy of the shunt switches.

Another advantage of the present invention is that the current controller can be controlled by a binary control signal in such a way that (i) said current controller is enabled or disabled dependent upon the actual value of said binary control signal, (ii) said control signal comprises an open circuit or short circuit condition that is applied to a first terminal of a control resistor whose second terminal is connected to said feedback branch at a point between said floating terminal of said load and said current feed means, and (iii) said power supply is one of a plurality of similar solar array sections. The solar array sections can be short circuited dependent on said binary control signal in order for the supply and demand of current to be matched in a spacecraft.

The above mentioned and other objects and features of the invention will become more apparent and the invention itself will be best understood by referring to the following description of an embodiment taken in conjunction with the accompanying drawings.

BRIEF DESCRIPTION OF THE DRAWINGS

FIG. 1 shows a schematic diagram of a power supply unit PSU in which a power supply shunt regulator PSSR according to the present invention is used;

FIG. 2 shows an equivalent circuit diagram of the power supply unit PSU and a shunt switch FET included in the power supply shunt regulator PSSR at turn on.

DETAILED DESCRIPTION

Figures 1, 2:
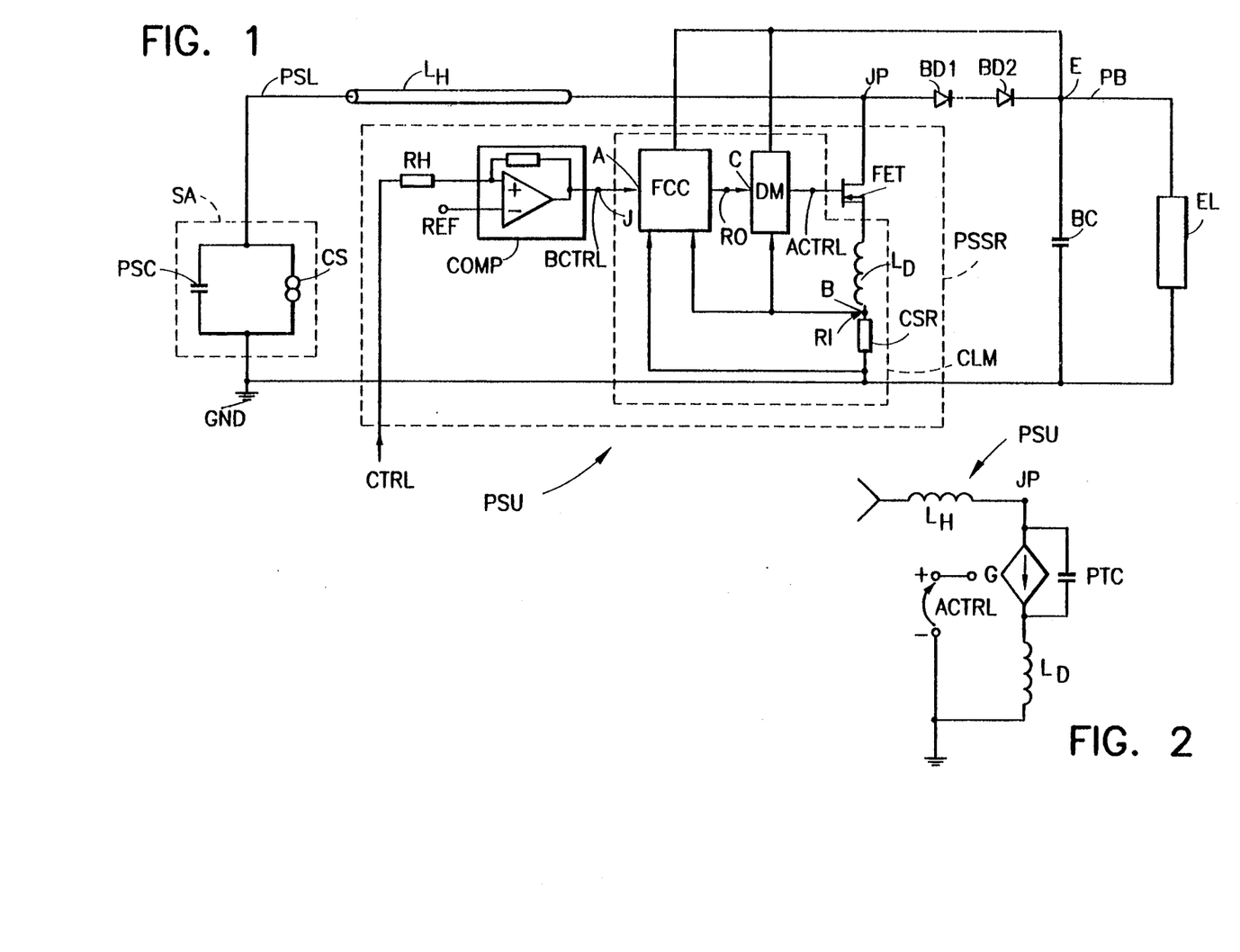

Referring to FIG. 1, the power supply unit PSU for instance can be used in a spacecraft in which electrical circuits comprise an electrical load EL which is powered by solar array sections such as the solar array section SA. Since both the power supplied by SA and the power required by EL, fluctuate in time, means has to be provided to match the supply to the demand. As is well known in the art, e.g. from the articles "Régulateur modulaire á grande puissance" Proc of the 3d ESTEC Spacecraft Power Conditioning Seminar, Noordwijk (NL), pp. 113–122, by A Poncin et al. or from the article "The Sequential Switching Shunt Regulator $S^3R$", ibid., by O'Sullivan et al., pp 123–131, the entire contents of said articles being incorporated herein by reference, this matching can be done by selectively short circuiting to ground GND a number of solar array sections such as SA so that only the power supplied by the remainder of the sections SA is combined via a power line PSL to power bus PB and supplied to EL. This selective short circuiting can be provided by a power supply shunt regulator PSSR of FIG. 1; regulator PSSR is controlled via a control input signal CTRL that is supplied to either turn "ON" or turn "OFF" a shunt switch which includes a Field Effect Transistor FET to either prevent or allow the power of solar array SA to be delivered to the load EL. The derivation of the signal CTRL is known from the above articles of Poncin and O'Sullivan and will therefore not be described here. In fact, it will be assumed throughout the following that this derivation is performed by way of the $S^3R$ technique known from the O'Sullivan article mentioned above. It is to be noted that one of the solar array sections SA will be in a switching mode wherein it is continuously turned "ON" and "OFF" in order to supply exactly the required amount of energy to the load EL and hence that the power supply shunt regulator has to be carefully designed due to this possible high switching strain.

Each solar array section SA includes a current source CS connected in parallel with a parasitic section capacitor PSC as shown in FIG. 1. The source CS is connected between a ground terminal GND and a power supply line PSL that has an equivalent so called "harness inductance" $L_H$. This power supply line PSL is, in turn, connected to a junction point JP to which a terminal of a power bus PB is coupled via diodes BD1 and BD2. The power bus PB has an equivalent bus capacitance BC which is in parallel to the electrical load EL and which is, as is load EL, connected between power bus PB and the ground terminal GND.

It is to be noted that the integrating nature of BC is such that with one solar array section in a switching mode it can be ensured that the power supplied to EL matches the sum of the amounts of power supplied by a number of solar array sections even when this sum is not exactly equal to the required power.

Finally, the power supply shunt regulator PSSR is also connected between the junction point JP and the ground terminal GND and has the control input signal CTRL connected thereto.

The power supply shunt regulator PSSR includes in more detail a branch connected in parallel to both the load EL and the solar array section SA and includes junction point JP and ground terminal GND the series connection of the shunt switch having the above-mentioned n-channel Field Effect Transistor FET, a degenerative inductor $L_D$ and a current sensing resistor CSR. The shunt switch FET determines the impedance, short or open circuit, of the above-mentioned branch and is therefore controlled by an analog control signal ACTRL which is derived from the control signal CTRL by the circuits COMP, FCC and DM as described hereafter. These three circuits COMP, FCC and DM are connected to the terminal E and thus receive a stable supply voltage from the power bus PB. It is to be noted that signal CTRL is coupled to COMP via a hysteresis resistor RH.

A symbolically represented comparator circuit COMP compares the signal provided by RH in response to the control signal CRTL with a reference signal REF, corresponding to the solar array section SA, and derives a binary control signal BCTRL which is supplied to an input terminal of an active negative feedback current controller FCC. The signal BCTRL has two states: a first one which is such that the current controller FCC sees at its input terminal a short circuit and a second one which is such that FCC sees at its input terminal an open circuit. The active negative feedback current controller FCC, which is enabled or disabled by the binary output signal BCTRL of COMP, further has a regulating input signal RI applied thereto via terminal B. Signal RI is generated by the voltage drop across the current sensing resistor CSR with respect to the ground terminal GND. FCC, when enabled, derives from signal RI a regulating output signal RO that is applied to terminal C of drive means DM. Signal RO comprises the voltage at terminal C with respect to ground GND. Drive means DM is connected to the ground terminal GND via the current sensing resistor CSR. The drive means DM then finally derives the analog control signal ACTRL from the regulating output signal RO.

The above-described elements $L_D$, CSR, FCC and DM form a current limiting means CLM that also comprises an active negative feedback loop and forms together with the comparator means COMP and with the shunt switch FET the power supply shunt regulator PSSR, shown in dashed lines in FIG. 1. The operation of the power supply unit PSU will be further described in detail with reference to the following figures.

FIG. 2 shows an equivalent electrical schematic circuit of the power supply unit PSU with the FET included in the regulator PSSR at "turn on". This schematic equivalent circuit includes the series connection of the harness inductor $L_H$, a simplified FET model shown as a parallel connection of a voltage controlled current source G with controlling voltage ACTRL, the parasitic transistor capacitor PTC, and the degenerative inductor $L_D$. The respective inductance, capacitance and gain values will hereafter be indicated with like named reference signs. It is to be noted that the other parasitic capacitors associated with the FET are neither shown in FIG. 2 nor considered in the following discussion since these capacitors were shown, both in stimulation and in experiments, to have a negligible influence on the transfer function derived below.

It can now be simply verified that the transfer function H(s) from ACTRL to the current flowing through the FET can be expressed in the Laplace domain as:

$$H(s) = \frac{G}{1 + G L_D s + PTC L_H s^2}$$

wherein setting $L_D$ equal to zero in the above transfer function would clearly yield that the transfer function H(s) had poles on the imaginary axis and therefore that the corresponding electrical circuits were unstable due to the coupling between PTC and $L_H$. Such instability will be of major importance when, as in the present embodiment, the shunt switch is an FET which commonly has a relatively large value for the capacitance PTC.

It can then be clearly seen from the above formula that through an appropriate choice of the inductance value $L_H$, the electrical circuit of FIG. 2, which corresponds to the power supply unit PSU at the moment the FET is "turned on", can be made unconditionally stable. It is therefore also clear that the FET, due to its relatively large PTC, can be combined with the advantageous active negative feedback current controller FCC described below when the above-mentioned electrical circuit is to be made stable in the simple way described above. Indeed, the feedback control of an intrinsically unstable circuit would appear to require a much more complex controller than that described below.

The negative feedback current controller FCC in combination with the degenerative inductor $L_D$ avoids these instability problems since its transfer function can be chosen in such a way that it reliably determines a desired response at "turn on" for the current flow through the FET and that the maximum current to which the "turn on" current will be limited only depends on the resistance value of resistor CSR and on the transfer function of FCC.

This negative feedback controller FCC and other parts of the current limitation means CLM shown in FIG. 1 will hereafter be described in detail with reference to FIG. 3, which more particularly represents those parts of CLM which derive the analog control signal ACTRL from both the binary control signal BCTRL and the regulating input signal RI appearing at terminal B, i.e. the voltage drop across resistor CSR. These parts are fed from the terminal E, on which a stable bus voltage is provided, and either the ground terminal GND or the floating terminal B of resistor CSR as will be described in detail below.

Figure 3:
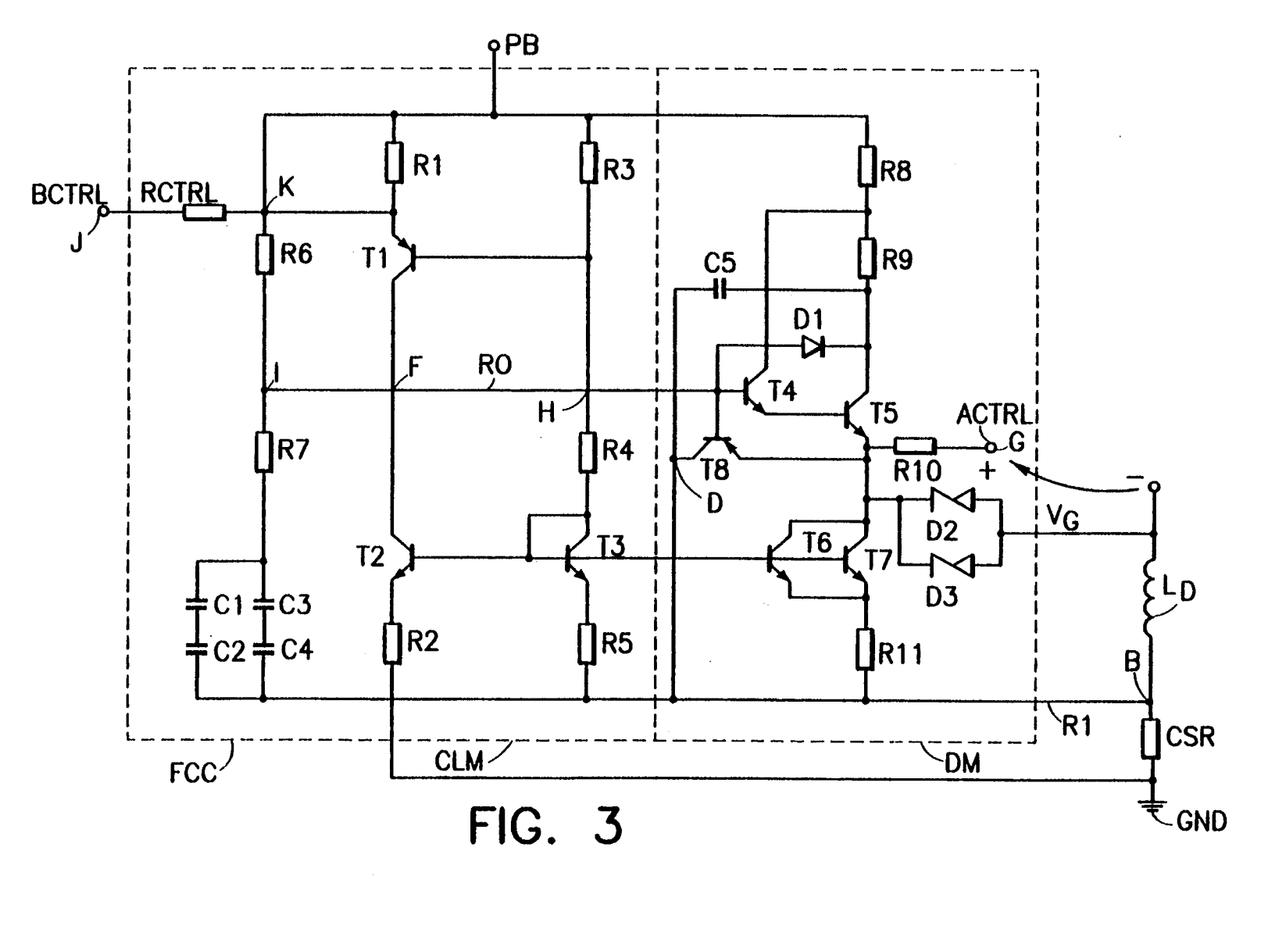
FIG. 3 is a detailed electrical circuit diagram of the power supply shunt regulator PSSR of FIG. 1.

As shown in FIG. 3, the feedback current controller FCC comprises three branches of which a feedback branch including R1, T1, T2 and R2 is connected to the ground terminal GND and wherein a polarization branch including R3, R4, T3 and R5 and a dynamic compensation branch including R6, R7 and C1 through C4 are connected to the floating terminal B of resistor CSR.

The feedback branch comprises the series connection of resistor R1, pnp-transistor T1, npn-transistor T2 and resistor R2 and receives the binary control signal BCTRL via a control resistor RCTRL, included to limit the reverse bias over transistor T1 when BCTRL is in its short circuit state, on the junction point of resistors R1 and transistor T1.

The polarization branch comprises the series connection of the resistors R3 and R4, the npn-transistor T3 and the resistor R5. The base electrode of transistor T1 is connected to the junction H of the resistors R3 and R4 while the base electrode of transistor T2 is connected to both the base and the collector electrodes of transistor T3 as well as to the resistor R4.

The dynamic compensation branch comprises the series connection of the resistor R6, the resistive means R7 and the capacitive means C1 through C4 which itself comprises the parallel connection of two branches each including a series connection of two capacitors C1, C2 and C3, C4. The capacitors C1 through C4 have equal capacitance values. The junction point I of the resistors R6 and R7 is connected to the junction point F of the transistors T1 and T2. Regulating output signal RO appears at connection point F. Signal RO comprises a voltage at F with respect to the ground.

The drive means comprising resistors R8–R11, capacitor C5, transistors T4–T8 and diode D1 is connected to the floating terminal B of resistor CSR. The drive means comprises amplifier means including a Darlington transistor pair formed with npn input and output transistors, T4 and T5 respectively. The base electrode of transistor T4 is connected to the aforementioned terminal F and its collector electrode is connected via resistor R8 to the power bus PB and via resistor R9 to the collector electrode of transistor T5. The emitter electrode of transistor T5 is in turn connected to a short circuit means comprising the parallel connection of npn-transistors T6 and T7, which in turn, is coupled in series with a resistor R11. The emitter electrode of transistor T6 is connected to one end of resistor R11 whose other end is connected to the floating terminal B of resistor CSR. The emitter electrode of transistor T5 is further connected via resistor R10 to a terminal G on which the analog control signal ACTRL is provided.

The drive means DM further includes a diode D1 connected between the base electrode of transistor T4 and the collector electrode of transistor T5 and a capacitor C5 coupled between the collector electrode of transistor T5 and the collector electrode of pnp-transistor T8 whose base electrode is connected to the base electrode of transistor T4 and whose emitter electrode is connected to the emitter electrode of transistor T5. The junction point D of capacitor C5 and transistor T8 is connected to the floating terminal B of resistor CRS. Two Zener diodes D2 and D3 are coupled in parallel between the junction point of the inductor $L_D$ and the shunt switch FET and the emitter electrode of transistor T5.

The operation of the feedback current controller FCC and the drive means DM as described above will now be discussed in detail.

As already mentioned, the binary control signal BCTRL can be considered as an enable/disable signal for the current controller FCC. Indeed, in its high impedance state FCC sees on its input terminal J, an open circuit and a circuit via transistor T1 in such a way that the current controller FCC will be enabled since it is not influenced by the signal BCTRL appearing at terminal J. If the signal BCTRL is such that current controller FCC experiences a short circuit on its terminal J, all current drawn from power bus PB via transistor resistor R1 in FIG. 3 will be dumped through this short circuit and consequently transistor T1 will be turned "OFF", the regulating output signal RO appearing at connection point F will then be shorted to the ground via transistor T2, resistor R2 and the amplifier means T4/T5 will also be in an open circuit configuration. The analog control signal ACTRL will therefore be short circuited to ground via the short circuit means comprising transistors T6/T7, and resistor R11 in such a way that the FET is turned "OFF". It can be appreciated from the above that in the latter case the operation of current controller FCC is disabled and that consequently the FET is closed.

The operation of current controller FCC will now be described from the moment signal BCTRL enables current controller FCC onwards.

It is however first to be noted that the Darlington transistor pair T1, T2 is coupled as a unity gain voltage amplifier from the regulating output signal at terminal F to the voltage appearing at the emitter electrode of transistor T5 which is achieved by the inclusion of resistor R11 in the short circuit means. From the moment current starts to flow through the branch RS/R9, T5/T7, R11, the short circuit means will operate as a current source for the whole duration in which the current controller FCC is enabled. Therefore, it is also clear that a negligible amount of current will flow from terminal F to the Darlington pair due to the infinite gain of the Darlington pair coupled in this way. The above has the advantage that the exact response of the Darlington pair need not be known.

In view of the above, the operation of current controller FCC can be understood as follows: when current controller FCC is enabled, the current can no longer leave current controller FCC via resistor RCTRL and will hence start to flow through transistor T1 which is turned "ON". Transistor T1 can, in this respect, be seen as a current feed towards terminal F and is rivalled by a current drain provided by transistor T2 drawing current away from the latter terminal F. When turn "ON" begins, the resulting effect is a current which flows, due to the above described Darlington configuration, through the compensation branch and causes the regulating output voltage RO appearing at terminal F to rise. The unity gain Darlington amplifier copies this voltage to the emitter electrode of transistor T5 in such a way that the control voltage ACTRL at terminal G on the gate electrode of the FET will also gradually increase and thus the FET is turned "ON" and allows current to flow through the branch in which it is included.

This turn "ON" of the FET results in an increase of the current flow through the shunt switch FET and hence an increase in the voltage drop across resistor CSR. This rate of increase of current flow is limited by the inductor $L_D$ and by the fact that the inductor $L_D$ has a local feedback effect on the FET due to the source voltage increase resulting from the changing current flow through the inductor $L_D$ which thus stabilizes the circuit as described above. But this increase in the voltage drop or regulating input signal at terminal B will also have an effect via the current controller FCC. Due to this increase, the voltages on the junction points of the polarization branch will also increase which verifiably leads to an increase in both the base voltage of the current feed transistor T1 and the current drain transistor T2. These increases respectively increase/decrease the current flowing to/from terminal F so that the current flowing through the compensation branch is reduced. Hence also, the regulating output signal or voltage at terminal F will decrease which results in a decrease of the voltage ACTRL appearing at terminal G.

From the above, it can be seen that the feedback and polarization branch together with the drive means achieve a negative feedback current control of the current flowing through the FET. This current control would in the absence of the compensation branch be too strong since then the infinite gain of the Darlington transistor pair would drive the FET almost instantaneously back to cut-off in such a way that in spite of the inclusion of $L_D$, the large open loop gain corresponding to the feedback loop CLM will lead to current overshoot and current ripple when the FET is turned "ON". These overshoot and ripple effects are less severe but also undesirable for the same reasons as mentioned above with regards to unstable operation.

Therefore, the present regulator PSSR requires the inclusion of the compensation branch in order to optimize the transfer function of FCC from terminal B to terminal F, i.e. in such a way that the current flow through the FET increases in a critically damped way to the maximum current, i.e. with least delay and without overshoot. This desired transfer function can then be achieved in a very simple way once the dynamic compensation branch is introduced. Indeed, this branch will almost completely determine the transfer function of FCC due to the fact that the amplifier means is a unity gain amplifier. In the present invention a desired transfer function can be achieved through inclusion in the compensation branch of resistive means R7 giving a proportional response and through inclusion of capacitive means C1-C4 giving an integrating response.

From the above qualitative discussion, it can be seen that the compensation capacitors C1-C4 determine the dynamic behavior of the current controller FCC and in combination with inductor $L_D$ the dynamic behavior of CLM. As explained above, the transfer function of the current controller FCC can, thanks to the stabilization performed by the inductor $L_D$, be so chosen that the voltage drop of signal RI at terminal B rises to a maximum voltage drop in a critically damped way. It is to be noted that the latter response is in particular obtained with the parameters for the PSSR listed in Table 1 below.

It is to be further noted that a number of redundant elements are included in the controller FCC in order to reduce a number of damaging failure modes. Firstly, there is the parallel and series redundancy of the capacitors C1-C4 which avoids the short circuit or open circuit failure modes of the capacitive means which is advantageous since these failure modes are very undesirable as explained above. The inclusion of a large resistor R6 (with very high resistance, see Table 1 below) further prevents, in the case of an open circuit failure of transistor T2, the signal RO at terminal F being in a high impedance state which might result in a constant linear operation of the FET and corresponding damage to this FET. Finally, the Zener diodes D2/D3 are included to avoid damage to the FET resulting from gate-to-source voltages exceeding 10 V and to avoid too negative gate-to-source voltages when the FET is turned "OFF". Such excessive negative voltages are equally damaging to the FET and are clearly avoided through the inclusion of Zener diodes D2/D3.

The turn "OFF" response of the power supply shunt regulator PSSR will be now briefly described.

Also at turn "OFF" the delay in reaching the steady state has to be diminished. Any delay, either in turning "ON" or "OFF" the FET results in some voltage ripple on the power bus PB which is a well known side-effect in the known S³R technique. When these delays become excessive, this voltage ripple may become such that two solar array sections SA are put by their control signals in switching modes as described above. This is very undesirable and therefore these delays are diminished in the present invention in the way described below. Further requirements are that switching does not cause excessive current changes which might lead to electro-magnetic interference and that the turn "OFF" is complete, i.e. that the FET is not controlled via signal ACTRL to operate constantly in a linear mode thereby dissipating excessive amounts of energy. The latter would be in conflict with the series redundancy of a redundant shunt switch as already described above. Through such a linear failure both shunt switches could be simultaneously damaged through excessive dissipation, making the redundancy useless.

The above requirements are met by the present shunt regulator PSSR as briefly discussed hereafter.

At turn "OFF" it is avoided by use of the inductor $L_D$ that this turn "OFF" would be too blunt resulting in production of the above-mentioned electro-magnetic interference. The local feedback effect of this inductor $L_D$ avoids such a blunt switching due to the fact that a decrease in current through inductor $L_D$ causes the voltage on the source electrode of the FET to decrease below the voltage at the ground terminal GND, thus opening the FET a little bit in response. This smoothing out of the current variation through the FET is desired since otherwise the current from the solar array SA, prohibited to vary rapidly by the harness inductance $L_H$, could no longer flow through the FET which in turn would lead to a large voltage peak on its drain electrode. The latter would be damaging for the FET due to a large transient response and would produce interference due to the current and voltage peaks induced by such switching.

It is further needed to suit the above requirements that the analog control signal ACTRL appearing on the gate electrode of the FET is rapidly and securely brought to the voltage on the ground terminal GND so that it is ensured that, when in steady state, the FET is totally "OFF" without unnecessary power dissipation. This is achieved rapidly in the present invention due to the fact that diode D1 avoids that a large saturation voltage is present over the transistors T4/T5 of the Darlington transistor pair and due to the presence of transistor T8 which is perfectly coupled to short terminal ACTRL at point G to the ground since it contributes, due to its coupling, to the discharge of the parasitic capacitors of the FET. This is achieved securely by the redundant short circuit means T6/T7 which have an extremely low collector-emitter voltage drop of about 0.1 V when not conducting any current. Due to their redundancy, it is moreover made highly unprobable that this short circuit will be lost which would produce as a consequence the linear operation of the FET at turn "OFF". For this reason the FET is also of the "hardened" type, i.e. its threshold voltage diminishes only slightly under the influence of radiation or ageing so that its linear operation during turn "OFF" is highly unlikely. Finally the dissipation is improved via the choice of the Darlington transistor pair, not needing an elaborate polarization circuit.

While the principles of the invention have been described above in connection with specific apparatus, it is to be clearly understood that this description is made only by way of example and not as a limitation on the scope of the invention.

Various changes and modifications may be made, within the scope of the inventive concept as defined by the appended claims.

TABLE 1 values and types of elements in FIG. 3

| RESISTOR ($\Omega$) | |
|---|---|
| RCTRL | 16K |
| R1 | 12.66K |
| R2 | 363.3 |
| R3 | 12.97K |
| R4 | 18.51K |
| R5 | 150 |
| R6 | 1.8M |
| R7 | 10K |

TABLE 1-continued

| values and types of elements in FIG. 3 | |
|---|---|
| R8 | 1.9K |
| R9 | 100 |
| R10 | 20 |
| R11 | 18 |
| CSR | 20M |
| TRANSISTORS (type) | |
| T1 | 2N2907A |
| T2/T3 | 2N2920 |
| T4/T5 | 2N3700 |
| T6/T7 | 2N2920 |
| T8 | 2N2907A |
| FET | IRF150 |
| CAPACITORS (F) | |
| C1-C4 | 330p |
| C5 | 1n |
| INDUCTOR (H) | |
| $L_D$ | 400n |
| DIODES (types) | |
| D1 | 1N5806 |
| D2/D3 | 1N4104 |

I claim:

1. A power supply shunt regulator (PSSR) including a branch (FET, $L_D$, CSR) which includes a series connection of at least a shunt switch (FET) and an inductive means ($L_D$), said branch being coupled in parallel with a load (EL) as well as in parallel with at least one power supply (SA), said regulator further including current limitation means (CLM) for generating an analog control signal (ACTRL) that is applied to a control electrode of said shunt switch so as to limit an amount of current flowing through said shunt switch, wherein said shunt regulator comprises:

a field effect transistor which functions as said shunt switch;

a negative feedback branch (FCC, DM, $L_D$) in said current limitation means (CLM);

said negative feedback branch being coupled between a current sensing resistor (CSR) that is included in said series connection (FET, $L_D$) and said control electrode of said field effect transistor shunt switch to regulate said analog control signal (ACTRL) in such a way that a voltage drop across said current sensing resistor (CSR) is lower than a maximum voltage drop which said field effect transistor shunt switch is designed to withstand; and said inductive means ($L_D$) being coupled to a source electrode of said field effect transistor shunt switch.

2. The power supply shunt regulator (PSSR) according to claim 1, wherein an inductance of said inductive means ($L_D$) is such that the regulator which is represented by the following equation is unconditionally stable:

$$H(s) = \frac{G}{1 + G L_b s + PTC\, L_H s^2}$$

wherein:

$L_b$ is said inductance of said inductive means $L_b$;
G is a voltage-to-current gain of said shunt switch;
PTC is a parasitic drain-to-source capacitance of said field effect transistor (FET);
$L_H$ is an equivalent inductance of a plurality of power supply lines (PSL) that interconnect said power supply (SA) with said branch (FET, $L_b$, CSR); and
s is a Laplacian variable.

3. The power supply shunt regulator (PSSR) according to claim 2, wherein said current limitation means (CLM) includes:

an active negative feedback current controller (FCC) for deriving from a regulating input signal (RI appearing at terminal B) that comprises a voltage drop that appears across said current sensing resistor (CSR), a regulating output signal (RO) on which the analog control signal (ACTRL) is based; and a transfer function for said regulating input signal (RI) and said regulating output signal (RO) of said negative feedback current controller (FCC), is determined so that said voltage drop across said current sensing resistor (CSR) is substantially critically damped to said maximum voltage drop.

4. The power supply shunt regulator (PSSR) according to claim 3, wherein:

said load (EL) and said current sensing resistor (CSR) are connected to a ground terminal (GND);

said current limitation means (CLM) includes drive means (DM) for generating said analog control signal (ACTRL) based on said regulating output signal (RO);

said drive means including a drive branch (R8/9, T4/5, T6/7, R11) having a series connection of an amplifier means (R8/9, T4/5) and a short circuit means (R11, T6/7), said drive branch being coupled between a floating terminal of each of said current sensing resistor (CSR) and said load (EL);

said drive branch generating said analog control signal (ACTRL) to be representative of a voltage that appears on a junction point of said amplifier means and said short circuit means; and said regulating output signal (RO) being connected to be an input signal to said amplifier means.

5. The power supply shunt regulator (PSSR) according to claim 3, wherein said negative feedback current controller (FCC) comprises:

a feedback branch (R1, T1, T2, R2) including a series connection of a current feed means (T1) and a current drain means (T2), said feedback branch being coupled in parallel with said load (EL);

said regulating output signal (RO) being provided at a connection point of said current feed means and said current drain means;

a polarization branch (R3, R4, T3, R5) for controlling both said current feed means and said current drain means, said polarization branch being coupled in parallel with said drive branch (R8/9, T4/5, T6/7, R11); and wherein an increase in said regulating input signal (RI) provides one of an increase and a decrease in a current flowing through said current drain means and said current feed means.

6. The power supply shunt regulator (PSSR) according to claim 5, wherein:

said current limitation means (CLM) includes said active negative feedback current controller (FCC) for deriving from the regulating input signal (RI) that comprises said voltage drop that appears across said current sensing resistor (CSR), said regulating output signal (RO) on which said analog control signal (ACTRL) is based;

said transfer function for said regulating input signal (RI) and said regulating output signal (RO) of said negative feedback current controller (FCC), is determined so that said voltage drop across current sensing resistor (CSR) substantially critically damps said maximum voltage drop;

said current controller (FCC) further includes a dynamic compensation branch (R6, R7, C1-C4) that is coupled in parallel with said drive branch (R8/9, T4/5, T6/7, R11), said dynamic compensation branch including a series connection of resistive means (R7) and capacitive means (C1-C4) coupled to a junction point (F between T1 and T2) of said feedback branch;

said amplifier means (R8/9, T4/5) includes a pair (T4, T5) of transistors connected to form a Darlington circuit having associated load resistances (R8/9);

said dynamic compensation branch is coupled as a unity gain voltage amplifier; and said short circuit means (R11, T6/T7) comprises a series connection of two transistors (T6/T7) coupled in parallel and a degenerative resistor (R11).

7. The power supply shunt regulator according to claim 6, wherein:

said capacitive means (C1-C4) comprises four compensation capacitors (C1, C2, C3 and C4) coupled in two parallel branches;

each of said parallel branches comprises a series connection of two of said compensation capacitors, said four compensation capacitors being connected to be equivalent to one capacitor having a capacitance value equal to a capacitance value of each of said compensation capacitors.

8. The power supply shunt regulator according to claim 6, further comprising:

another short circuit means;

a diode (D1) coupled between a base electrode of an input transistor (T4) of said pair of transistors (T4, T5) and a collector electrode of an output transistor (T5) of said pair of transistors (T4, T5); and said another short circuit means comprising:

another transistor (TS) having a base electrode connected to a base electrode of said input transistor (T4); and said another transistor having:

an emitter electrode coupled to an emitter electrode of said output transistor (T5); and a collector electrode coupled to said connection point (B) of said current sensing resistor (CRS).

9. The power supply shunt regulator (PSSR) according to claim 4, wherein:

said negative feedback current controller (FCC) is controlled by a binary control signal (BCTRL), which is input thereto;

said negative feedback current controller (FCC) is one of enabled and disabled dependent upon an actual value of said binary control signal (BCTRL);

said analog control signal comprises one of an open circuit and a short circuit condition that is provided at a first terminal of a control resistor (RCTRL); and a second terminal of said control resistor (RCTRL) is connected to said feedback branch (R1, T1, T2, R2) at a connection point (K) between a floating terminal of said load (EL) and a floating terminal of said current feed means (T1).

10. The power supply shunt regulator (PSSR) according to claim 9, wherein said power supply (SA) comprises one solar array section of a plurality of similar solar array sections, said power supply shunt regulator further comprising:

means for selectively short circuiting said one solar array section depending on said binary control signal (BCTRL) to match a power supply input and a demand for current in a spacecraft.

* * * * *